(12) United States Patent
Shappir et al.

(10) Patent No.: US 7,652,930 B2
(45) Date of Patent: Jan. 26, 2010

(54) METHOD, CIRCUIT AND SYSTEM FOR ERASING ONE OR MORE NON-VOLATILE MEMORY CELLS

(75) Inventors: Assaf Shappir, Kiryat Ono (IL); Ilan Bloom, Haifa (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 10/537,857

(22) PCT Filed: Apr. 3, 2005

(86) PCT No.: PCT/IL2005/000367

§ 371 (c)(1),
(2), (4) Date: Jun. 7, 2005

(87) PCT Pub. No.: WO2005/094178

PCT Pub. Date: Oct. 13, 2005

(65) Prior Publication Data

US 2006/0056240 A1    Mar. 16, 2006

Related U.S. Application Data

(60) Provisional application No. 60/558,105, filed on Apr. 1, 2004.

(51) Int. Cl.
*G11C 11/34* (2006.01)

(52) U.S. Cl. .............................. 365/185.29; 365/185.2; 365/185.22

(58) Field of Classification Search ............ 365/185.29, 365/185.22, 185.19, 185.3, 185.33, 185.2, 365/185.15, 185.18
See application file for complete search history.

(56) References Cited

U.S. PATENT DOCUMENTS

| 3,881,180 A | 4/1975 | Gosney, Jr. |
| 3,895,360 A | 7/1975 | Cricchi et al. |
| 4,342,102 A | 7/1982 | Puar |
| 4,388,705 A | 6/1983 | Sheppard |
| 4,527,257 A | 7/1985 | Cricchi |
| 4,667,217 A | 5/1987 | Janning |
| 4,725,984 A | 2/1988 | Ip et al. |
| 4,733,106 A | 3/1988 | Shin et al. |
| 4,742,491 A | 5/1988 | Liang et al. |
| 4,761,764 A | 8/1988 | Watanabe |

(Continued)

FOREIGN PATENT DOCUMENTS

EP    0 656 628    6/1995

(Continued)

*Primary Examiner*—Dang T Nguyen
(74) *Attorney, Agent, or Firm*—EMPK & Shiloh, LLP

(57) ABSTRACT

The present invention is a method circuit and system for erasing one or more non-volatile memory ("NVM") cells in an NVM array. One or more NVM cells of a memory array may be erased using an erase pulse produced by a controller and/or erase pulse source adapted to induce and/or invoke a substantially stable channel current in the one or more NVM cells during an erasure procedure. The voltage profile of an erase pulse may be predefined or the voltage profile of the erase pulse may be dynamically adjusted based on feedback from a current sensor during an erase procedure.

15 Claims, 9 Drawing Sheets

U.S. PATENT DOCUMENTS

| | | |
|---|---|---|
| 4,857,770 A | 8/1989 | Partovi et al. |
| 4,916,671 A | 4/1990 | Ichiguchi |
| 4,961,010 A | 10/1990 | Davis |
| 5,027,321 A | 6/1991 | Park |
| 5,029,063 A | 7/1991 | Lingstaedt et al. |
| 5,042,009 A | 8/1991 | Kazerounian et al. |
| 5,081,371 A | 1/1992 | Wong |
| 5,142,495 A | 8/1992 | Canepa |
| 5,142,496 A | 8/1992 | Van Buskirk |
| 5,237,213 A | 8/1993 | Tanoi |
| 5,241,497 A | 8/1993 | Komarek |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,335,198 A | 8/1994 | Van Buskirk et al. |
| 5,345,425 A | 9/1994 | Shikatani |
| 5,349,221 A | 9/1994 | Shimoji |
| 5,359,554 A | 10/1994 | Odake et al. |
| 5,361,343 A | 11/1994 | Kosonocky et al. |
| 5,381,374 A | 1/1995 | Shiraishi et al. |
| 5,400,286 A | 3/1995 | Chu et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,434,825 A | 7/1995 | Harari et al. |
| 5,440,505 A | 8/1995 | Fazio et al. |
| 5,450,341 A | 9/1995 | Sawada et al. |
| 5,450,354 A | 9/1995 | Sawada et al. |
| 5,477,499 A | 12/1995 | Van Buskirk et al. |
| 5,508,968 A | 4/1996 | Collins et al. |
| 5,521,870 A | 5/1996 | Ishikawa |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,074 A | 12/1996 | Akaogi et al. |
| 5,596,527 A | 1/1997 | Tomioka et al. |
| 5,608,679 A | 3/1997 | Mi et al. |
| 5,612,642 A | 3/1997 | McClinyock |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,657,332 A | 8/1997 | Auclair et al. |
| 5,663,907 A | 9/1997 | Frayer et al. |
| 5,672,959 A | 9/1997 | Der |
| 5,675,280 A | 10/1997 | Nomura |
| 5,677,869 A | 10/1997 | Fazio et al. |
| 5,689,459 A | 11/1997 | Chang et al. |
| 5,694,356 A | 12/1997 | Wong et al. |
| 5,708,608 A | 1/1998 | Park et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,726,946 A | 3/1998 | Yamagata et al. |
| 5,748,534 A | 5/1998 | Dunlap et al. |
| 5,751,637 A | 5/1998 | Chen et al. |
| 5,754,475 A | 5/1998 | Bill et al. |
| 5,760,634 A | 6/1998 | Fu |
| 5,768,193 A | 6/1998 | Lee et al. |
| 5,771,197 A | 6/1998 | Kim |
| 5,774,395 A | 6/1998 | Richart et al. |
| 5,781,476 A | 7/1998 | Seki et al. |
| 5,784,314 A | 7/1998 | Sall et al. |
| 5,787,036 A | 7/1998 | Okazawa |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,828,601 A | 10/1998 | Hollmer et al. |
| 5,841,700 A | 11/1998 | Chang |
| 5,847,441 A | 12/1998 | Cutter et al. |
| 5,861,771 A | 1/1999 | Matsuda et al. |
| 5,867,429 A | 2/1999 | Chen et al. |
| 5,870,334 A | 2/1999 | Hemink et al. |
| 5,870,335 A | 2/1999 | Khan et al. |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,926,409 A | 7/1999 | Engh et al. |
| 5,933,367 A | 8/1999 | Matsuo et al. |
| 5,936,888 A | 8/1999 | Sugawara |
| 5,940,332 A | 8/1999 | Artieri |
| 5,946,258 A | 8/1999 | Evertt et al. |
| 5,949,714 A | 9/1999 | Hemink et al. |
| 5,949,728 A | 9/1999 | Liu et al. |
| 5,963,412 A | 10/1999 | En |
| 5,969,993 A | 10/1999 | Takeshima |
| 5,982,666 A | 11/1999 | Campardo |
| 5,986,940 A | 11/1999 | Atsumi et al. |
| 5,991,202 A | 11/1999 | Derhacobian et al. |
| 5,999,444 A | 12/1999 | Fujiwara et al. |
| 6,005,423 A | 12/1999 | Schultz |
| 6,011,725 A | 1/2000 | Eitan |
| 6,028,324 A | 2/2000 | Su et al. |
| 6,034,896 A | 3/2000 | Ranaweera et al. |
| 6,040,610 A | 3/2000 | Noguchi et al. |
| 6,044,019 A | 3/2000 | Cernea et al. |
| 6,044,022 A | 3/2000 | Nachumovsky |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,118,207 A | 9/2000 | Ormerod et al. |
| 6,118,692 A | 9/2000 | Banks |
| 6,128,226 A | 10/2000 | Eitan et al. |
| 6,130,572 A | 10/2000 | Ghilardelli et al. |
| 6,130,574 A | 10/2000 | Bloch et al. |
| 6,134,156 A | 10/2000 | Eitan |
| 6,147,904 A | 11/2000 | Liron |
| 6,150,800 A | 11/2000 | Kinoshita et al. |
| 6,154,081 A | 11/2000 | Pakkala et al. |
| 6,157,242 A | 12/2000 | Fukui |

| | | | |
|---|---|---|---|
| 6,157,570 A | 12/2000 | Nachumovsky | |
| 6,169,691 B1 | 1/2001 | Pasotti et al. | |
| 6,181,605 B1 | 1/2001 | Hollmer et al. | |
| 6,185,143 B1 | 2/2001 | Perner et al. | |
| 6,188,211 B1 | 2/2001 | Rincon-Mora et al. | |
| 6,192,445 B1 | 2/2001 | Rezvani | |
| 6,198,342 B1 | 3/2001 | Kawai | |
| 6,201,737 B1 | 3/2001 | Hollmer et al. | |
| 6,205,056 B1 | 3/2001 | Pan et al. | |
| 6,208,200 B1 | 3/2001 | Arakawa | |
| 6,214,666 B1 | 4/2001 | Mehta | |
| 6,215,148 B1 | 4/2001 | Eitan | |
| 6,215,697 B1 | 4/2001 | Lu et al. | |
| 6,215,702 B1 | 4/2001 | Derhacobian et al. | |
| 6,219,277 B1 | 4/2001 | Devin et al. | |
| 6,222,762 B1 | 4/2001 | Guterman et al. | |
| 6,233,180 B1 | 5/2001 | Eitan et al. | |
| 6,240,032 B1 | 5/2001 | Fukumoto | |
| 6,240,040 B1 | 5/2001 | Akaogi et al. | |
| 6,246,555 B1 | 6/2001 | Tham | |
| 6,252,799 B1 | 6/2001 | Liu et al. | |
| 6,256,231 B1 | 7/2001 | Lavi et al. | |
| 6,266,281 B1 | 7/2001 | Derhacobian et al. | |
| 6,282,133 B1 | 8/2001 | Nakagawa et al. | |
| 6,285,246 B1 | 9/2001 | Basu | |
| 6,285,589 B1 | 9/2001 | Kajitani | |
| 6,285,614 B1 | 9/2001 | Mulatti et al. | |
| 6,292,394 B1 | 9/2001 | Cohen et al. | |
| 6,297,974 B1 | 10/2001 | Ganesan et al. | |
| 6,304,485 B1 | 10/2001 | Harari et al. | |
| 6,307,784 B1 | 10/2001 | Hamilton et al. | |
| 6,307,807 B1 | 10/2001 | Sakui et al. | |
| 6,320,786 B1 | 11/2001 | Chang et al. | |
| 6,324,094 B1 | 11/2001 | Chevallier | |
| 6,326,265 B1 | 12/2001 | Liu et al. | |
| 6,330,192 B1 | 12/2001 | Ohba et al. | |
| 6,331,950 B1 | 12/2001 | Kuo et al. | |
| 6,339,556 B1 | 1/2002 | Watanabe | |
| 6,343,033 B1 | 1/2002 | Parker | |
| 6,351,415 B1 | 2/2002 | Kushnarenko | |
| 6,353,356 B1 | 3/2002 | Liu | |
| 6,353,554 B1 | 3/2002 | Banks | |
| 6,353,555 B1 | 3/2002 | Jeong | |
| 6,356,469 B1 | 3/2002 | Roohparvar et al. | |
| 6,359,501 B2 | 3/2002 | Lin et al. | |
| 6,385,086 B1 | 5/2002 | Mihara et al. | |
| 6,396,741 B1 | 5/2002 | Bloom et al. | |
| 6,400,209 B1 | 6/2002 | Matsuyama et al. | |
| 6,407,537 B2 | 6/2002 | Antheunis | |
| 6,426,898 B1 | 7/2002 | Mihnea et al. | |
| 6,433,624 B1 | 8/2002 | Grossnickle et al. | |
| 6,438,031 B1 | 8/2002 | Fastow | |
| 6,442,074 B1 | 8/2002 | Hamilton et al. | |
| 6,445,030 B1 | 9/2002 | Wu et al. | |
| 6,449,190 B1 | 9/2002 | Bill | |
| 6,452,438 B1 | 9/2002 | Li | |
| 6,456,528 B1 | 9/2002 | Chen | |
| 6,456,533 B1 | 9/2002 | Hamilton et al. | |
| 6,469,929 B1 | 10/2002 | Kushnarenko et al. | |
| 6,469,935 B2 | 10/2002 | Hayashi | |
| 6,477,085 B1 | 11/2002 | Kuo | |
| 6,490,204 B2 | 12/2002 | Bloom et al. | |
| 6,496,414 B2 | 12/2002 | Kasa et al. | |
| 6,510,082 B1 | 1/2003 | Le et al. | |
| 6,512,501 B1 * | 1/2003 | Nagaoka et al. | 345/66 |
| 6,512,701 B1 | 1/2003 | Hamilton et al. | |
| 6,515,909 B1 * | 2/2003 | Wooldridge | 365/185.22 |
| 6,519,180 B2 | 2/2003 | Tran et al. | |
| 6,519,182 B1 | 2/2003 | Derhacobian et al. | |
| 6,522,585 B2 | 2/2003 | Pasternak | |
| 6,525,969 B1 | 2/2003 | Kurihara et al. | |
| 6,529,412 B1 | 3/2003 | Chen et al. | |
| 6,529,417 B2 * | 3/2003 | Roohparvar | 365/185.33 |
| 6,535,020 B1 | 3/2003 | Yin | |
| 6,535,434 B2 | 3/2003 | Maayan et al. | |
| 6,552,387 B1 | 4/2003 | Eitan | |
| 6,567,303 B1 | 5/2003 | Hamilton et al. | |
| 6,567,312 B1 | 5/2003 | Torii et al. | |
| 6,574,139 B2 | 6/2003 | Kurihara | |
| 6,577,514 B2 | 6/2003 | Shor et al. | |
| 6,577,532 B1 | 6/2003 | Chevallier | |
| 6,577,547 B2 | 6/2003 | Ukon | |
| 6,584,017 B2 | 6/2003 | Maayan et al. | |
| 6,590,811 B1 | 7/2003 | Hamilton et al. | |
| 6,594,181 B1 | 7/2003 | Yamada | |
| 6,608,526 B1 | 8/2003 | Sauer | |
| 6,614,295 B2 | 9/2003 | Tsuchi | |
| 6,618,290 B1 | 9/2003 | Wang et al. | |
| 6,624,672 B2 | 9/2003 | Confaloneri et al. | |
| 6,627,555 B2 | 9/2003 | Eitan et al. | |
| 6,636,440 B2 | 10/2003 | Maayan et al. | |
| 6,639,837 B2 | 10/2003 | Takano et al. | |
| 6,639,844 B1 | 10/2003 | Liu et al. | |
| 6,639,849 B2 | 10/2003 | Takahashi et al. | |
| 6,643,177 B1 | 11/2003 | Le et al. | |
| 6,643,178 B2 | 11/2003 | Kurihara | |
| 6,643,181 B2 | 11/2003 | Sofer et al. | |
| 6,643,184 B2 * | 11/2003 | Pio | 365/185.29 |
| 6,650,568 B2 | 11/2003 | Iijima | |
| 6,654,296 B2 | 11/2003 | Jang et al. | |
| 6,665,769 B2 | 12/2003 | Cohen et al. | |
| 6,677,805 B2 | 1/2004 | Shor et al. | |
| 6,690,602 B1 | 2/2004 | Le et al. | |
| 6,700,818 B2 | 3/2004 | Shappir et al. | |
| 6,723,518 B2 | 4/2004 | Papsidero et al. | |
| 6,768,165 B1 | 7/2004 | Eitan | |
| 6,788,579 B2 | 9/2004 | Gregori et al. | |
| 6,791,396 B2 | 9/2004 | Shor et al. | |
| 6,798,699 B2 * | 9/2004 | Mihnea et al. | 365/185.29 |
| 6,831,872 B2 | 12/2004 | Matsuoka | |
| 6,836,431 B2 | 12/2004 | Chang | |
| 6,839,280 B1 * | 1/2005 | Chindalore et al. | 365/185.2 |
| 6,885,585 B2 | 4/2005 | Maayan et al. | |
| 6,917,544 B2 | 7/2005 | Maayan et al. | |
| 6,928,001 B2 | 8/2005 | Avni et al. | |
| 2002/0004878 A1 | 1/2002 | Norman | |
| 2002/0132436 A1 | 9/2002 | Eliyahu et al. | |
| 2002/0145465 A1 | 10/2002 | Shor et al. | |
| 2002/0191465 A1 | 12/2002 | Maayan et al. | |
| 2003/0021155 A1 | 1/2003 | Yachareni et al. | |
| 2003/0072192 A1 | 4/2003 | Bloom et al. | |
| 2003/0076710 A1 | 4/2003 | Sofer et al. | |
| 2003/0117841 A1 | 6/2003 | Yamashita | |
| 2003/0131186 A1 | 7/2003 | Buhr | |
| 2003/0142544 A1 | 7/2003 | Maayan et al. | |
| 2003/0202411 A1 | 10/2003 | Yamada | |
| 2003/0206435 A1 | 11/2003 | Takahashi | |
| 2003/0208663 A1 | 11/2003 | Van Buskirk et al. | |
| 2003/0214844 A1 | 11/2003 | Iijima | |
| 2003/0218913 A1 | 11/2003 | Le et al. | |
| 2003/0227796 A1 | 12/2003 | Miki et al. | |
| 2004/0012993 A1 | 1/2004 | Kurihara | |
| 2004/0013000 A1 | 1/2004 | Torii | |
| 2004/0027858 A1 | 2/2004 | Takahashi et al. | |
| 2004/0151034 A1 | 8/2004 | Shor et al. | |
| 2004/0153621 A1 | 8/2004 | Polansky et al. | |
| 2005/0105337 A1 * | 5/2005 | Cohen et al. | 365/185.18 |

FOREIGN PATENT DOCUMENTS

| | | |
|---|---|---|
| EP | 0693781 | 1/1996 |
| EP | 0 843 398 | 5/1998 |
| EP | 1 071 096 | 1/2001 |
| EP | 1126468 | 8/2001 |
| EP | 0740307 | 12/2001 |
| EP | 1164597 | 12/2001 |

| | | |
|---|---|---|
| EP | 001217744 | 3/2004 |
| JP | 63-249375 | 10/1988 |
| JP | 3-285358 | 12/1991 |
| JP | 07193151 | 7/1995 |
| JP | 408106791 | 4/1996 |
| JP | 408297988 | 11/1996 |
| JP | 09162314 | 6/1997 |
| JP | 10-106276 | 4/1998 |
| JP | 10 334676 | 12/1998 |
| JP | 02001118392 | 4/2001 |
| JP | 02002216488 | 8/2002 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/036651 | 5/2003 |
| WO | WO 03/063167 | 7/2003 |
| WO | WO 03/063168 | 7/2003 |
| WO | WO 03/079370 | 9/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/100790 | 12/2003 |

* cited by examiner

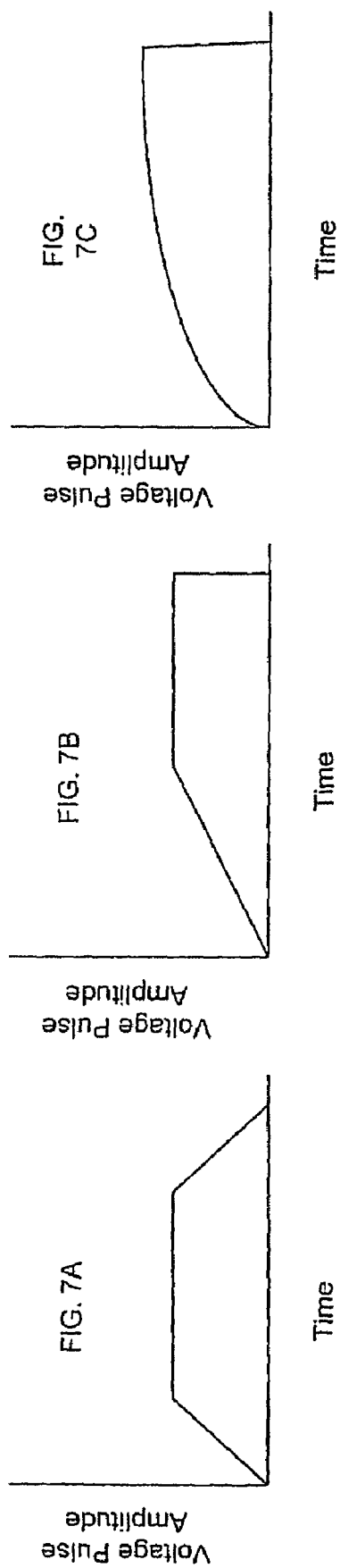
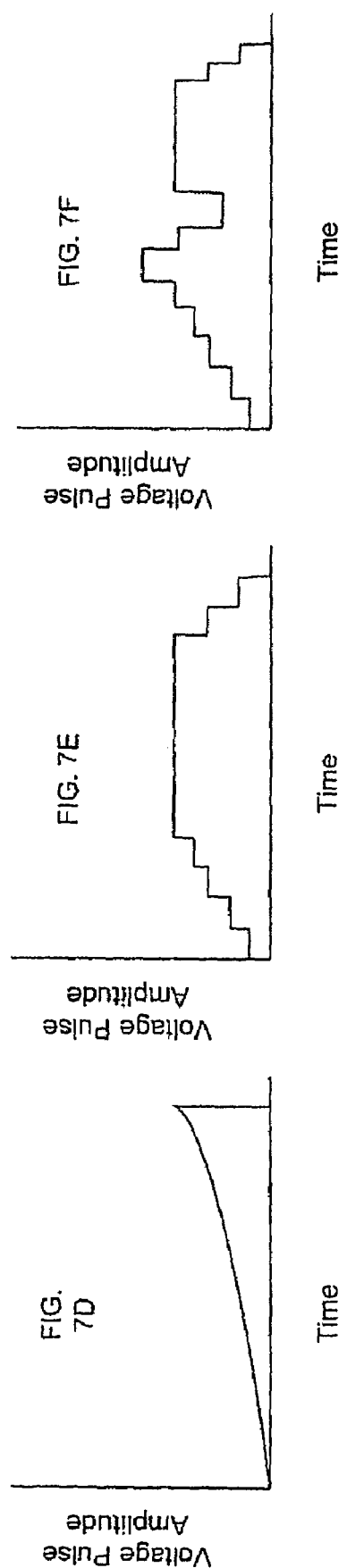

METHOD, CIRCUIT AND SYSTEM FOR ERASING ONE OR MORE NON-VOLATILE MEMORY CELLS

RELATED APPLICATIONS

This application claims the benefit of U.S. provisional patent application 60/558,105 filed Apr. 1, 2004.

FIELD OF THE INVENTION

The present invention generally relates to the field of non-volatile memory ("NVM") cells More specifically, the present invention relates to a method, circuit and system for erasing one or more NVM cells using one or more non-constant voltage erase pulses

BACKGROUND OF THE INVENTION

Non-volatile memory ("NVM") cells are fabricated in a large variety of structures, including but not limited to Polysilicon floating gate, as shown in FIG. 2A, and Nitride Read Only Memory ("NROM"), as shown in FIG. 2B As is well known, an NVM cell's state may be defined and determined by its threshold voltage ("Vt"), the gate to source/drain voltage at which the cell begins to significantly conduct current Different threshold voltage ranges are associated with different logical states, and a NVM cell's threshold voltage level may be correlated to the amount of charge (e g electrons) stored in a charge storage region of the cell. FIG. 1A shows a voltage distribution graph depicting possible threshold voltage distributions of a binary non-volatile memory cell, wherein vertical lines depict boundary voltage values correlated with each of the cell's possible states Cells having Vt Lower than EV level may be said to be erased verified Cells having Vt Higher than PV may be said to be program verified. These two limits define the completion of programming and erase sequences that may be performed on a cell. A Program sequence of programming pulses may be used to drive the Vt of a cell higher than PV, while an erase sequence may drive the cell's Vt lower than EV. Also visible in FIG. 1A are vertical lines designating a Read Verify (RV) level and an Intermediate Program Verify voltage, $PV^1$, designating the start of regions before the Program Verify threshold FIG. 1B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc), another set of vertical lines depict boundary values correlated with the Read Verify level of each of the cell's possible Program states (RV00, RV01, etc), and yet another set depict boundary lines for Intermediate Program Verify voltages ($PV^100$, $PV^101$, etc.) associated with each of the states The amount of charge stored in a charge storage region of an NVM cell, may be increased by applying one or more programming pulses to the cell. While the amount of charge in the cell may decrease by applying an erase pulse to the NVM cell which may force the charge reduction in the cell's charge storage region, and consequently may decrease the NVM's threshold is voltage A simple method used for operating NVM cells (e.g. programming, reading, and erasing) uses one or more reference structures such as reference cells to generate the reference levels (i.e. PVs, EVs) Each of the one or more reference structures may be compared against a memory cell being operated in order to determine a condition or state of the memory cell being operated. Generally, in order to determine whether an NVM cell is at a specific state, for example erased, programmed, or programmed at one of multiple possible program states within a multi-level cell ("MLC"), the cell's threshold level is compared to that of a reference structure whose threshold level is preset and known to be at a voltage level associated with the specific state being tested for Comparing the threshold voltage of an NVM cell to that of a reference cell is often accomplished using a sense amplifier. Various techniques for comparing an NVM's threshold voltage against those of one or more reference cells, in order to determine the state(s) of the NVM's cells, are well known When programming an NVM cell to a desired state, a reference cell with a threshold voltage set at a voltage level defined as a "program verify" level for the given state may be compared to the threshold voltage of the cell being programmed in order to determine whether a charge storage area or region of the cell being programmed has been sufficiently charged so as to be considered "programmed" at the desired state If after a programming pulse has been applied to a cell, it has been determined that a cell has not been sufficiently charged in order for its threshold voltage to be at or above a "program verify" level (i e the threshold voltage of the relevant reference cell) associated with the target program state, the cell is typically hit with another programming pulse to try to inject more charge into its charge storage region Once a cell's threshold value reaches or exceeds the "program verify" level to which it is being programmed, no further programming pulse should be applied to the cell Groups or sets of cells within an NVM array may be programmed and/or erased concurrently The group or set of NVM cells may consist of cells being programmed to (or erased from) the same logical state, or may consist of cells being programmed to (or erased from) each of several possible states, such as may be the case with MLC arrays. Since not all cells have the same susceptibility to being programmed and/or being erased, cells within a set of cells receiving programming or erasing pulses may not program or erase at the same rate Some cells may reach a target program state, or an erased state, before other cells in the same set of cells that are receiving programming or erasing pulses concurrently A further issue associated with the erasure of one or more NVM cells within a set of cells being erased, is that channel current invoked during NVM (e g NROM) cell erasure using constant voltages pulses is characterized by a high peak, which quickly subsides (See FIG. 3). The cause of such a channel current profile is carriers created by band-to-band tunneling at the surface of the deeply depleted drain junction (associated with Gate Induce Drain Leakage) More specifically, in a NVM cell, including but not limited to NROM cells, carries may be injected into the gate dielectric stack (or floating gate, if such exists), thereby reducing the vertical electric field which facilitates current flow and causing the current to subside, as evident from the current graph of FIG. 3.

One of the drawbacks of such a channel current profile during erasure is that the channel current peak in each of the NVM cells being erased limits the amount of cells that can be erased simultaneously, either due to current consumption limits imposed on memory product and/or due to limitations on the circuits implemented in the NVM product (e.g. charge pump failures) Furthermore, the efficiency of the constant voltage erase pulse also subsides with time, as is evident from the graphs in FIG. 4, which FIG. 4 shows the reduction of channel current, along with the reduction of the highest threshold voltage, within an NVM array population receiving a 3 ms constant voltage erase pulse as a function of time As evident from FIG. 4, both the channel current and the rate of the downward threshold voltage shift subsides shortly after the beginning of the erasure pulse and the erasure process becomes significantly less efficient during the latter portion of the pulse (i.e. current continues flowing –04 mA in this example, yet the threshold voltage is downward shift is very slow)

Although during the second half of a constant voltage erase pulse a current may still flow through the cells, erasure of the cells becomes very slow and weak Thus, the result of a channel current profile associated with a constant voltage erase pulse is, (1) relatively large current consumption during cell erasure, and (2) erasure inefficiency. These two drawbacks translate into reduced erase rates in many NVM (e g NROM) memory product (or any other memory technology incorporating tunnel assisted hot carrier injection), also reducing the number of cells which can be erased simultaneously and requiring that the duration of erase pulses be sufficiently long to compensate for erasure inefficiency By comparison, whereas a typical programming pulse may have a duration of several hundred nanoseconds, a typical erase pulse may have a duration of several microseconds.

There is a need in the field of NVM production for improved methods, circuits and systems of erasing one or more NVM cells.

SUMMARY OF THE INVENTION

The present invention is a method circuit and system for erasing one or more non-volatile memory ("NVM") cells in an NVM array. According to some embodiments of the present invention, one or more NVM cells of a memory array may be erased using a controller and/or erase pulse source adapted to induce and/or invoke a substantially stable channel current in the one or more NVM cells during an erasure procedure According to some embodiments of the present invention, the substantially stable channel current induced by the controller and/or erase pulse source may be a substantially constant channel current.

According to some embodiments of the present invention, the controller and/or erase pulse source may produce an erase pulse having a non-constant voltage profile The erase pulse may be at a relatively smaller voltage level at its start and may grow to a relatively larger voltage level near its end An erase pulse according to some further embodiments of the present invention may have a substantially ramp-like, trapezoidal, exponential-growth-like, or asymptote-like voltage profile, or the erase pulse may be comprised of voltage steps According to some embodiments of the present invention, the voltage profile of an erase pulse may be predefined, while according to other embodiments of the present invention, the voltage profile of the erase pulse may be dynamically adjusted during an erase procedure. Further embodiments of the present invention may include a current sensing circuit to sense the amount of current passing through the channels of one or more NVM cells during an erase procedure as result of an erase pulse being applied to the one or more NVM cells A controller may receive a signal from the current sensing circuit indicating the amount of current flowing through the one or more NVM cells and may cause an erase pulse source to adjust the voltage of the current pulse being applied to the one or more NVM cells so as to maintain a substantially stable and/or substantially constant channel current through the one or more NVM cells.

According to further embodiments of the present invention, an erase pulse may be applied to sub-groups or sub-sets of a set of NVM cells to be erased in a staggered sequence During the course of a signal erase pulse of a fixed duration, the pulse may first be applied to a first sub-set of cells. After some fraction of the fixed erase pulse duration, the pulse may than be applied to a second sub-set A cell select and masking circuit, coupled with a controller, may facilitate a single erase pulse being applied in a staggered sequence across several sub-sets of a set of NVM cells to be erased by the given erase pulse For example, during the first microsecond of a four microsecond erase pulse, the select circuit may only apply the erase pulse to a first sub-set of cells After the first microsecond, the select circuit may close a switch by which the erase pulse is also applied to a second sub-set, and so on. According to some embodiments of the present invention, a circuit connecting the erase pulse to the first sub-set of NVM cells to experience the erase pulse may be opened while other sub-sets are still experiencing the erase pulse According to further embodiments of the present invention, a cell select and masking circuit, coupled with a controller which is receiving a signal from a current sensor, may facilitate a single erase pulse being applied in a staggered sequence across several sub-sets of a set of NVM cells to be erased by the given erase pulse The erase pulse may first be applied to a first sub-set of cells, and once the controller receives a signal from the sensor that the current to the erase first sub-set of cells is subsiding, the controller may signal the cell select circuit to apply the erase pulse to a second sub-set The current select circuit may apply the erase current to each additional sub-set of cells every-time the erase pulse current begins to subside and/or falls below some predefined current level, until all the sub-sets of cells have experienced the erase pulse.

The voltage of an erase pulse, according to some embodiments of the present invention, may be ramped from a low value to a desired voltage level. For example, the gates of the NVM cells to be erased may be fully biased to the desired level(s), the NVM cells' well may be grounded, the NVM cells' source lines may be floated after grounding, and the NVM cells' drain lines may be incrementally ramped to the desired level. The NVM cells' current consumption may be continuously monitored and the voltage ramp rate may be dynamically adjusted by a feedback loop in order to prevent the current from exceeding a pre-specified limit

BRIEF DESCRIPTION OF THE DRAWINGS

The subject matter regarded as the invention is particularly pointed out and distinctly claimed in the concluding portion of the specification The invention, however, both as to organization and method of operation, together with objects, features and advantages thereof, may best be understood by reference to the following non limiting detailed description when read with the accompanied drawings in which:

FIGS. 7A to 7F is a series of voltage graphs, each showing possible erase pulse voltage profiles according to various embodiments of the present invention, wherein FIG. 7F shows a voltage profile of an erase pulse dynamically stepped and adjusted based on feedback from a current sensor;

DETAILED DESCRIPTION OF THE INVENTION

Figure 1A:
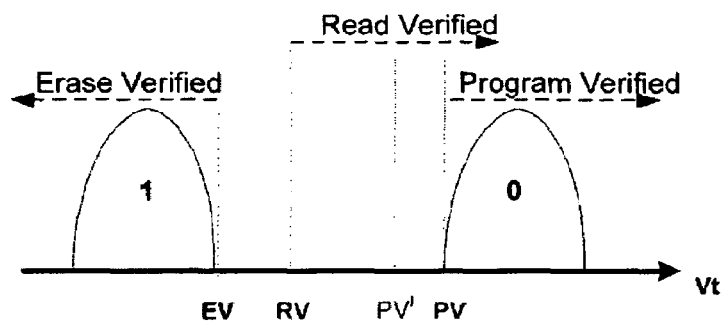
FIG. 1A shows a voltage distribution graph depicting possible threshold voltage distributions in the charge storage region of a binary non-volatile memory cell, wherein vertical lines depict boundary values or voltage threshold level correlated with the Program Verify, Read Verify and Intermediate Program Verify levels for each of the cell's possible program states.
Figure 1B:
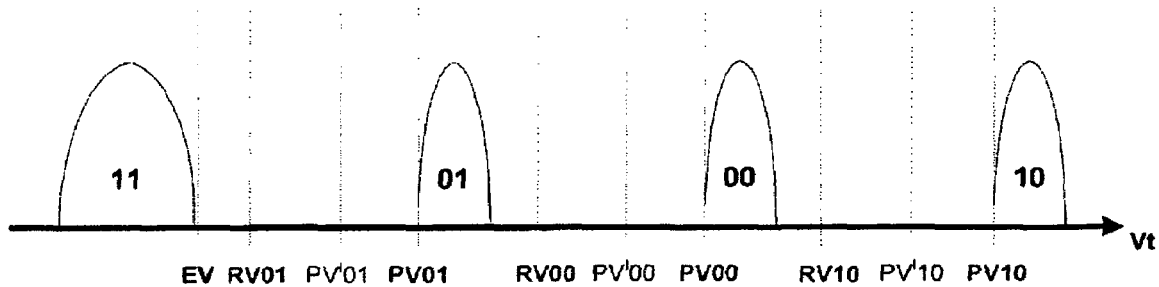
FIG. 1B shows a voltage distribution graph depicting possible threshold voltage distributions in the charge storage region of a multi-level non-volatile memory cell ("MLC"), wherein sets of vertical lines depict boundary values or voltage threshold levels correlated with the Program Verify, Read Verify and Intermediate Program Verify levels for each of the cell's possible states.
Figures 2A, 2B:
FIG. 2A shows a block diagram depicting a side cross sectional view of a floating gate memory cell.
FIG. 2B shows a block diagram depicting a side cross sectional view of a Nitride Read Only Memory ("NROM") cell having to distinct programming charge storage regions.
Figure 3:
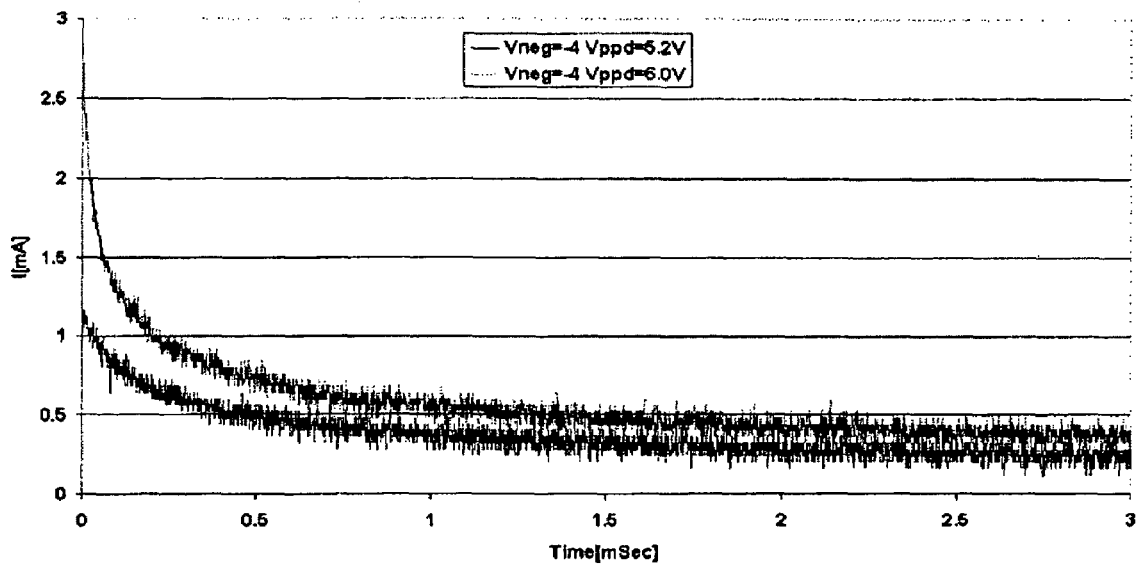
FIG. 3 is a channel current vs. time graph showing a channel current profile of an NVM cell during erasure.
Figure 4:
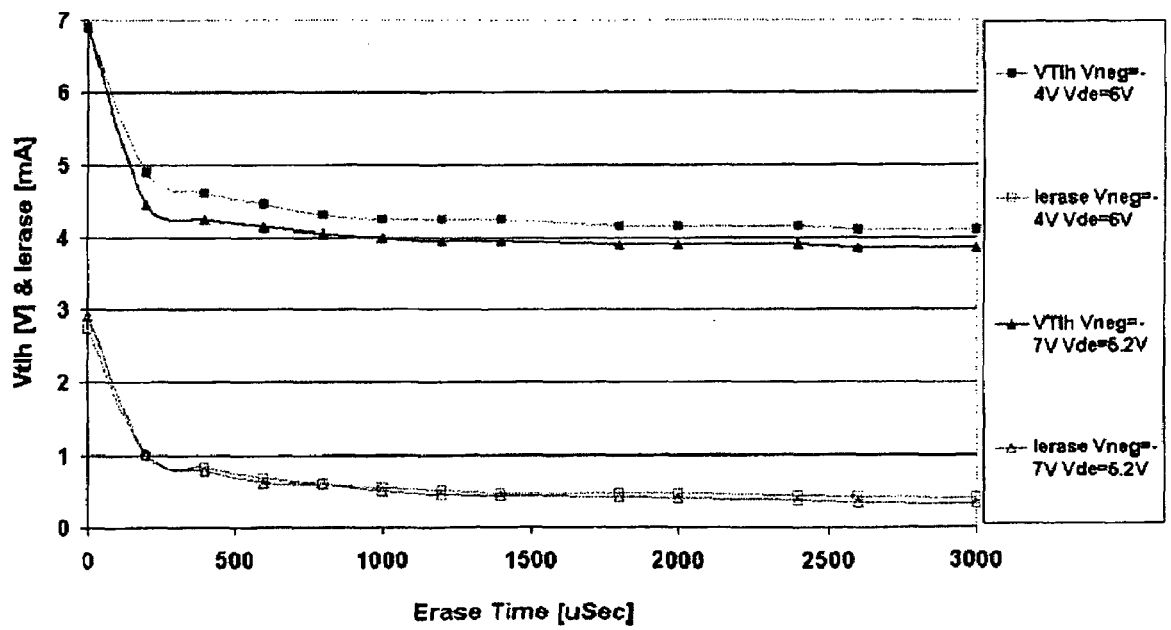
FIG. 4 shows the reduction of channel current, along with the reduction of the highest threshold voltage, within an NVM array population receiving a 3 ms constant voltage erase pulse as a function of time and at various erase pulse voltages.

In the following detailed description, numerous specific details are set forth in order to provide a thorough understanding of the invention However it will be understood by those of ordinary skill in the art that the present invention may be practiced without these specific details In other instances, well-known methods and procedures have not been described in detail so as not to obscure the present invention Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein This apparatus may be specially constructed for the desired purposes, or it may comprise a general purpose computer selectively activated or reconfigured by a computer program stored in the computer The present invention is a method circuit and system for erasing one or more non-volatile memory ("NVM") cells in an NVM array According to some embodiments of the present invention, one or more NVM cells of a memory array may be erased using a controller and/or erase pulse source adapted to induce and/or invoke a substantially stable channel current in the one or more NVM cells during an erasure procedure According to some embodiments of the present invention, the substantially stable channel current induced by the controller and/or erase pulse source may be a substantially constant channel current.

According to some embodiments of the present invention, the controller and/or erase pulse source may produce an erase pulse having a non-constant voltage profile The erase pulse may be at a relatively smaller voltage level at its start and may grow to a relatively larger voltage level near its end An erase pulse according to some further embodiments of the present invention may have a substantially ramp-like, trapezoidal, exponential-growth-like, or asymptote-like voltage profile, or the erase pulse may be comprised of voltage steps According to some embodiments of the present invention, the voltage profile of an erase pulse may be predefined, while according to other embodiments of the present invention, the voltage profile of the erase pulse may be dynamically adjusted during an erase procedure Further embodiments of the present invention may include a current sensing circuit to sense the amount of current passing through the channels of one or more NVM cells during an erase procedure as result of an erase pulse being applied to the one or more NVM cells A controller may receive a signal from is the current sensing circuit indicating the amount of current flowing through the one or more NVM cells and may cause an erase pulse source to adjust the voltage of the current pulse being applied to the one or more NVM cells so as to maintain a substantially stable and/or substantially constant channel current through the one or more NVM cells According to further embodiments of the present invention, an erase pulse may be applied to sub-groups or sub-sets of a set of NVM cells to be erased in a staggered sequence. During the course of a signal erase pulse of a fixed duration, the pulse may first be applied to a first sub-set of cells. After some fraction of the fixed erase pulse duration, the pulse may than be applied to a second sub-set A cell select and masking circuit, coupled with a controller, may facilitate a single erase pulse being applied in a staggered sequence across several sub-sets of a set of NVM cells to be erased by the given erase pulse For example, during the first microsecond of a four microsecond erase pulse, the select circuit may only apply the erase pulse to a first sub-set of cells After the first microsecond, the select circuit may close a switch by which the erase pulse is also applied to a second sub-set, and so on According to some embodiments of the present invention, a circuit connecting the erase pulse to the first sub-set of NVM cells to experience the erase pulse may be opened while other sub-sets are still experiencing the erase pulse.

The voltage of an erase pulse, according to some embodiments of the present invention, may be ramped from a low value to a desired voltage level For example, the gates of the NVM cells to be erased may be fully biased to the desired level(s), the NVM cells' well may be grounded, the NVM cells' source lines may be floated after grounding, and the NVM cells' drain lines may be incrementally ramped to the desired level. The NVM cells' current consumption may be continuously monitored and the voltage ramp rate may be dynamically adjusted by a feedback loop in order to prevent the current from exceeding a pre-specified limit.

Figure 5:
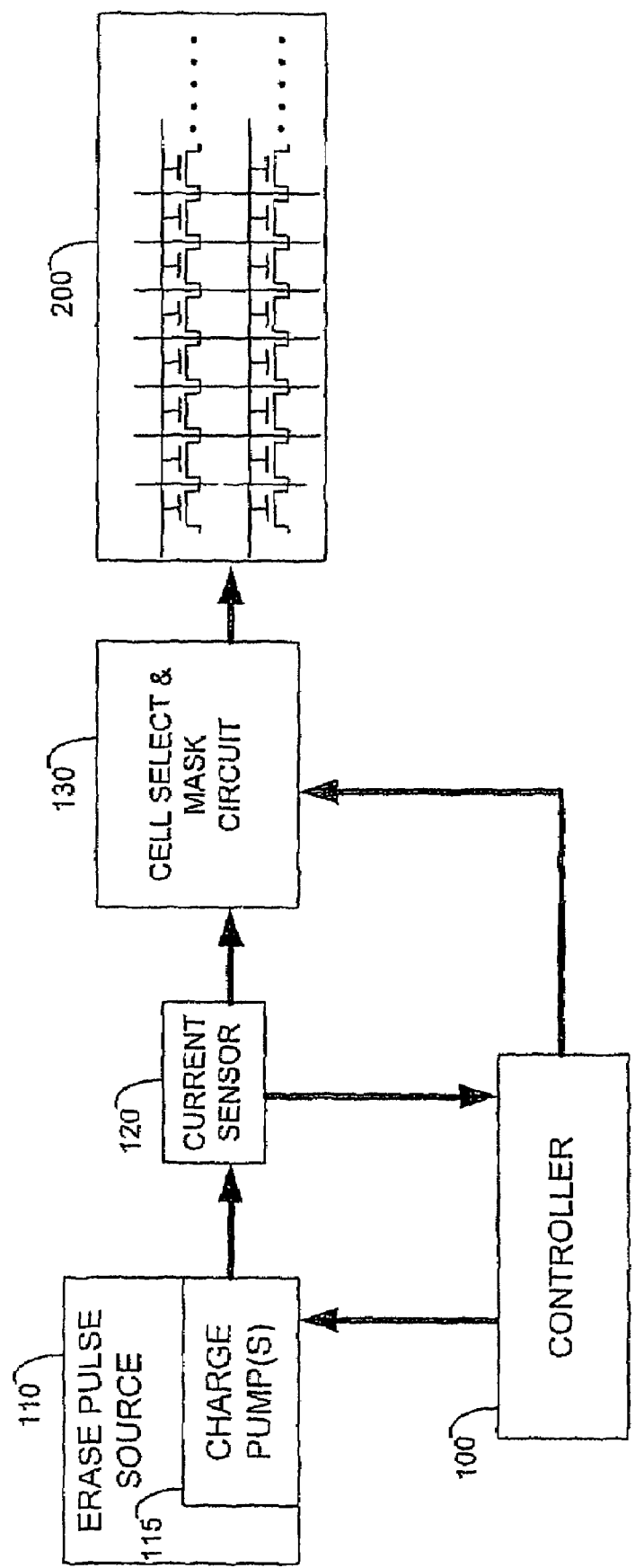
FIG. 5 is a block diagram showing an exemplary NVM array erasing circuit according to some embodiments of the present invention.

Turing now to FIG. 5, there is shown a block diagram of an exemplary NVM array erasing circuit according to some embodiments of the present invention An erase pulse source 110 may include a charge-pump 115, and in is response to a signal from a controller 100 may produce an erase pulse with a substantially non-constant voltage profile The controller 100 may cause the erase pulse source 110 to produce a pulse having a predefined voltage profile, for example, a ramp-like, trapezoidal, exponential-growth-like, or asymptote-like voltage profile, as shown in FIGS. 7A through 7D According to some embodiments of the present invention, the controller 100 may cause the erase pulse source 110 to produce a pulse with a stepped voltage profile, such as those shown in FIGS. 7E through 7F.

Figure 6:
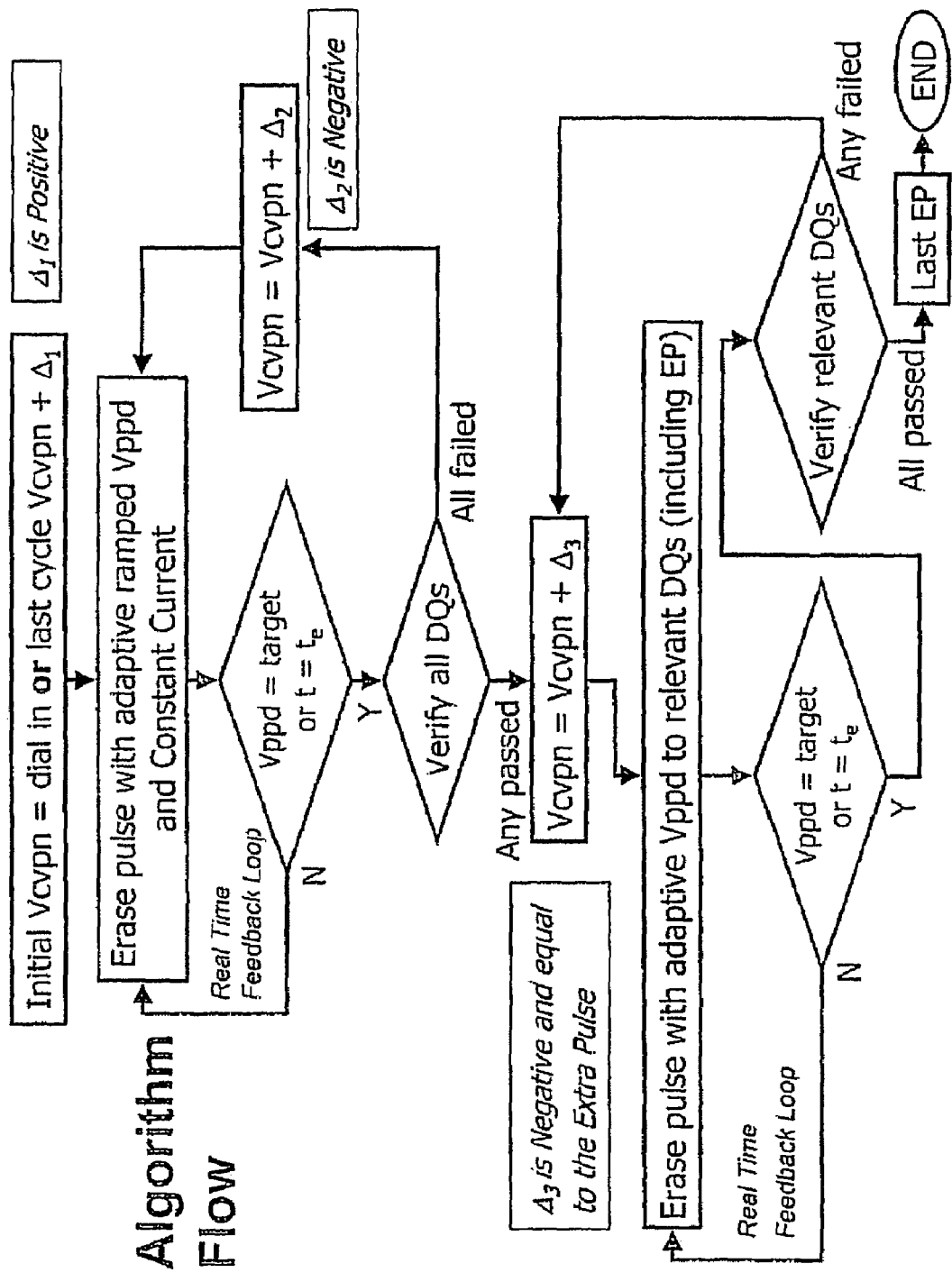
FIG. 6 is a flow diagram of an exemplary method by which the voltage of an erase pulse according to some embodiments of the present invention may be dynamically adjusted based on feedback from a current sensor.
Figure 8:
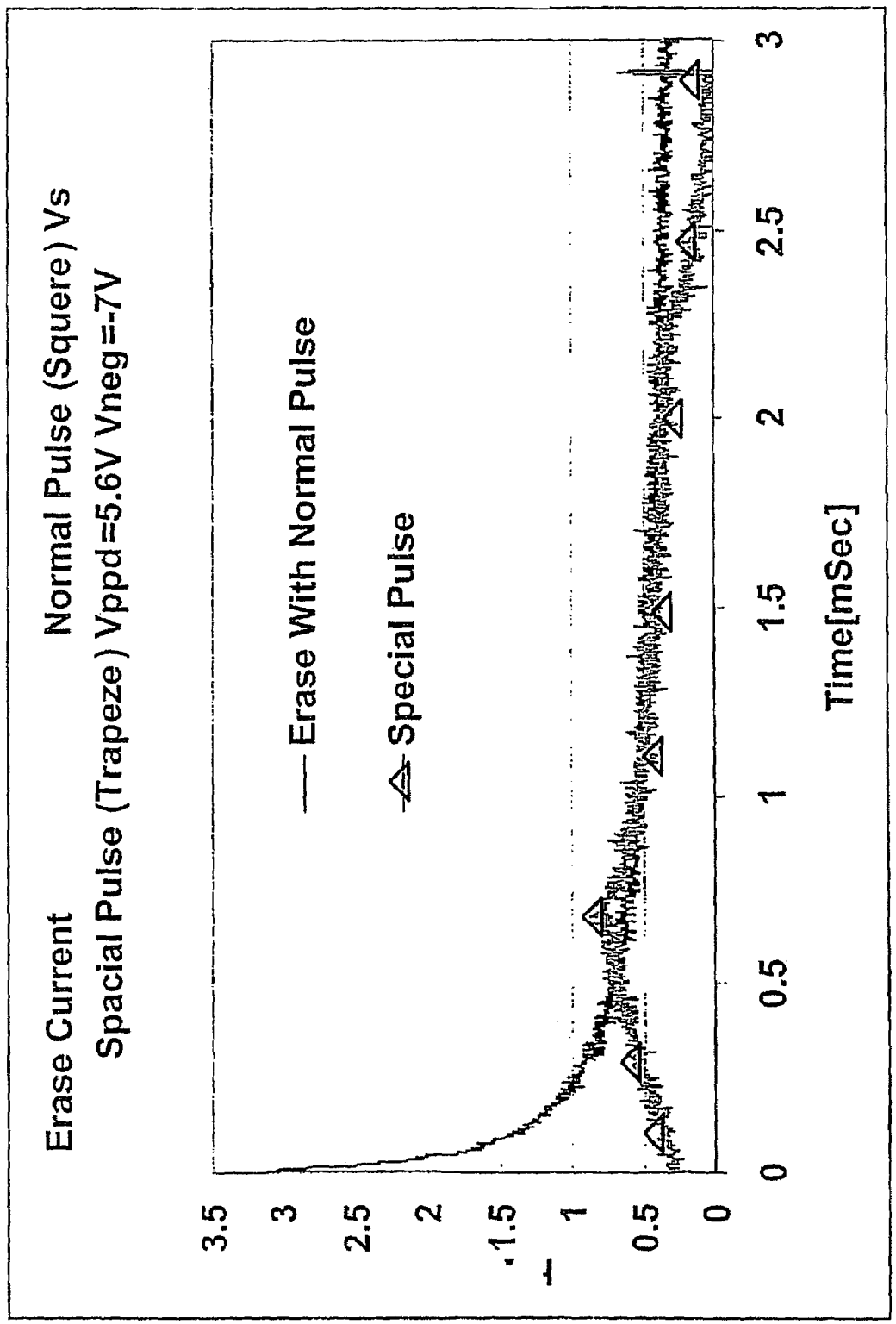
FIG. 8 is a channel current vs time graph showing an exemplary is channel current profile of an NVM cell during an erasure procedure according one or more embodiments of the present invention.
Figure 9:
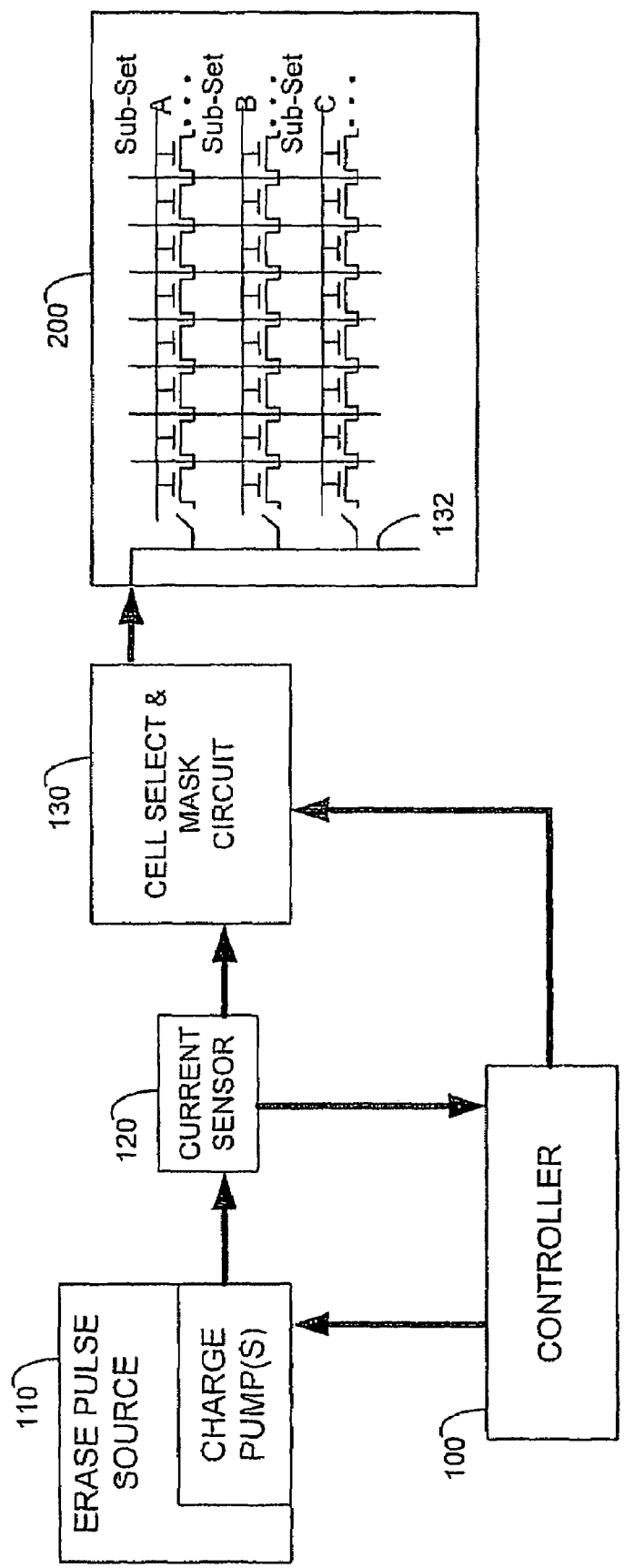
FIG. 9 is a block diagram showing another exemplary NVM array erasing circuit according to some embodiments of the present invention, including an erase pulse staggering circuit.

According to further embodiments of the present invention, controller 100 may cause the erase pulse source to step the voltage of the erase pulse up and/or down in response to a signal received from a sensor 120. The sensor 120 may be a current sensor, a voltage sensor, a voltage derivative sensor or a current derivative sensor, and may provide the controller 100 a signal indicating some characteristic of the current (e.g. amount) flowing through the set of NVM cells 200 receiving the erase pulse. The controller 100 may cause the erase pulse source to adjust the voltage of an erase up or down in order to maintain a substantially stable channel current through one or more NVM cells within the set of NVM cells 200 receiving the erase pulse. For example, if either the current flowing through the channel is approaching or exceeding some predefined current limit, of if the current is increasing very rapidly (i e spiking), the controller 100 may direct the pulse source 110 to step down the voltage of the erase pulse, as exemplified in the middle portion of FIG. 7F Turning now to FIG. 6, there is shown a flow diagram of an exemplary method/algorithm by which the voltage of an erase pulse according to some embodiments of the present invention may be dynamically adjusted based on feedback from a current sensor 120 The figure shows a specific example relating to a gate stepping based erase algorithm with real time current to sensing feedback loop and adapted to maintain a constant current flowing through NVM cells experiencing an erased pulse according to some embodiments of the present invention This algorithm may be implemented by the controller 100 or by any functionally similar circuit. It should be understood by one of ordinary skill in the art that any one of many algorithms may be used in order to maintain a substantially stable and/or substantially constant channel current through NVM cells receiving an erase pulse according to various embodiments of the present invention FIG. 8 is a channel current vs. time graph showing an exemplary channel current profile of an NVM cell during an erasure procedure according one or more embodiments of the present invention As evident from FIG. 8, the channel current flowing through one or more NVM cells in response to an erase pulse according to some embodiments of the present invention is substantially stable and/or constant as compared to the channel current flowing through the same one or more NVM cells in response to constant erase pulse Turning now to FIG. 9, there is shown a block diagram of another exemplary NVM array erasing circuit according to some embodiments of the present invention, including an NVM select and/or mark circuit 130 and an erase pulse staggering circuit 132. According to some embodiments of the present invention, an erase pulse may be applied to sub-groups or sub-sets of a set of NVM cells 200 to be erased in a staggered sequence During the course of a signal erase pulse of a fixed duration (e.g. 3 microseconds), the pulse may first be applied to a first sub-set of cells. After some fraction of the fixed erase pulse duration, the pulse may than be applied to a second sub-set. The cell select and masking circuit 130, coupled with the pulse staggering circuit 132 (i.e. a series of switches), may facilitate a single erase pulse being applied in a staggered sequence across several sub-sets of a set of NVM cells to be erased by the given erase pulse For example, during the first microsecond of a four microsecond erase pulse, the select circuit may only apply the erase pulse to a first sub-set of cells. After the first microsecond, the select circuit may close a switch by which the erase pulse is also applied to a second sub-set, and so on, and so on. According to some embodiments of the present invention, a circuit connecting the erase pulse to the first sub-set of NVM cells to experience the erase pulse may be opened while other sub-sets are still experiencing the erase pulse, such that each sub-set of NVM cells experiences the erase pulse for substantially the same period of time.

Figure 10:
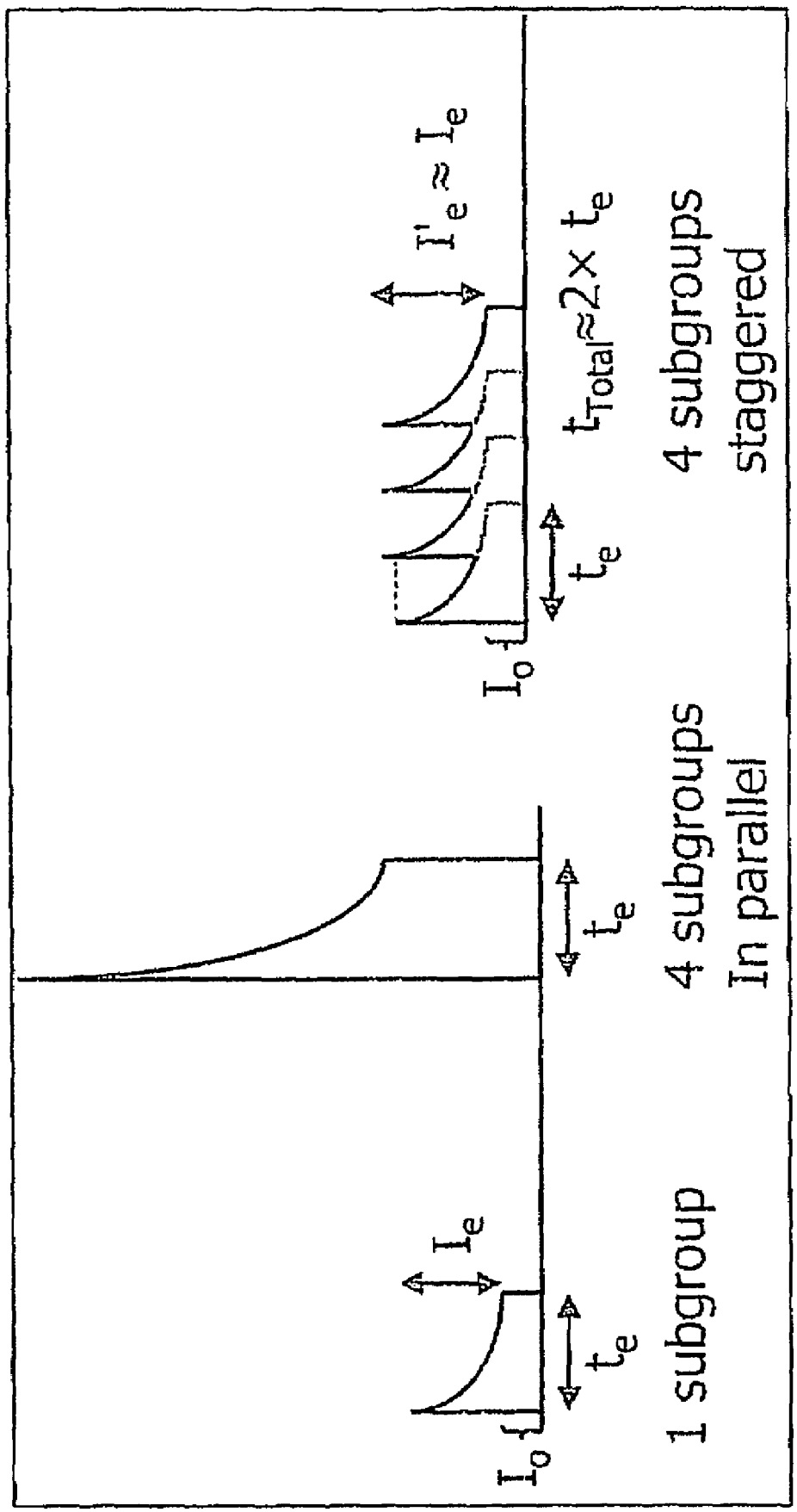
FIG. 10 is a set of current graphs showing the results of staggering the application of an erase pulse to several sub-sets of a set of NVM cells, in accordance with some embodiments of the present invention It will be appreciated that for simplicity and clarity of these non-limiting illustrations, elements shown in the figures have not necessarily been drawn to scale For example, the dimensions of some of the elements may be exaggerated relative to other elements for clarity. Further, where considered appropriate, reference numerals may be repeated among the figures to indicate corresponding or analogous elements

According to further embodiments of the present invention, a cell select and masking circuit 130, coupled with a controller 100 which is receiving a signal from a current sensor 120, may facilitate a single erase pulse being applied in a staggered sequence across several sub-sets of a set of NVM cells 200 to be erased by the given erase pulse. The erase pulse may first be applied to a first sub-set of cells, and once the controller 100 receives a signal from the sensor 120 that the current to the erase first sub-set of cells is subsiding, the controller 100 may signal the cell select circuit 130 to apply the erase pulse to a second sub-set. The current select circuit 130 may apply the erase current to each additional sub-set of cells every-time the erase pulse current begins to subside and/or falls below some predefined current level, until all the sub-sets of cells have experienced the erase pulse Turning now to FIG. 10, there is shown a set of current graphs exemplifying the results of staggering the application of an erase pulse to several sub-sets of a set of NVM cells 200, in accordance with some embodiments of the present invention, such as the one shown in FIG. 9 Evident from FIG. 10, is that by applying an erase pulse to a sub-set of cells produces a lower overall peak current than applying the same erase pulse to the full set. By applying the erase pulse to each of the sub-sets in a staggered sequence (i e starting with the first sub-set and adding sub-sets, one sub-set at a time, each over some time interval), the overall current peak experienced by the NVM cell array 200 may be reduced and may spread across the duration of the erase pulse While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method of erasing one or more non-volatile memory ("NVM") cells comprising: applying to the one or more NVM cells an erase pulse having a predominantly non-flat and non-linear voltage profile, and wherein said erase pulse has a predefined voltage profile selected from the group consisting of ramp-like, exponential-growth-like, asymptote-like and stepped.

2. The method according to claim 1, wherein the erase pulse is applied to each sub-set of a set of NVM cells in a staggered sequence.

3. The method according to claim 1, wherein the voltage profile of the erase pulse is dynamically adjusted based on feedback.

4. The method according to claim 3, wherein the feedback comes from a sensor selected from the group consisting of a current sensor, a voltage sensor, a current derivative sensor, and a voltage derivative sensor.

5. The method according to claim 4, wherein the voltage of the erase pulse is adjusted in an inverse relation to current measure by the current sensor.

6. The method according to claim 4, wherein the voltage of the erase pulse is adjusted at a rate correlated to a signal produced by the current derivative sensor.

7. A circuit for erasing one or more non-volatile memory ("NVM") cells comprising: an erase pulse source to produce an erase pulse having a predominantly non-flat and non-linear voltage profile, and wherein said erase pulse source is adapted to produce an erase pulse having a predefined voltage profile selected from the group consisting of ramp-like, exponential-growth-like, asymptote-like and stepped.

8. The circuit according to claim 7, further comprising a cell select circuit adapted to select to which cells of a set of NVM cells the erase pulse is applied.

9. The circuit according to claim 8, wherein said cell select circuit is adapted to apply the erase pulse to each sub-set of the set of NVM cells in a staggered sequence.

10. The circuit according to claim 7, further comprising a sensor to sense a characteristic of the erase pulse as it is being applied to the one or more NVM cells.

11. The circuit according to claim 10, wherein the sensor is selected from the group consisting of a current sensor, a voltage sensor, a current derivative sensor, and a voltage derivative sensor.

12. The circuit according to claim 7, further comprising a controller to cause the erase pulse source to adjust the voltage profile of the erase pulse based on a signal from said sensor.

13. The circuit according to claim 12, wherein said controller causes the voltage of the erase pulse to be adjusted in an inverse relation to current measure by the current sensor.

14. The circuit according to claim 12, wherein said controller causes the voltage of the erase pulse to be adjusted at a rate correlated to a signal produced by the current derivative sensor.

15. A system for erasing one or more non-volatile memory ("NVM") cells comprising: A NVM array, and an erase pulse source to produce an erase pulse having a predominantly non-flat and non-linear voltage profile, and wherein said erase pulse source is adapted to produce an erase pulse having a predefined voltage profile selected from the group consisting of ramp-like, exponential-growth-like, asymptote-like and stepped.

* * * * *